(12) United States Patent
Nguyen et al.

(10) Patent No.: US 12,506,455 B2
(45) Date of Patent: Dec. 23, 2025

(54) CIRCUIT AND METHOD OF PROVIDING COMMON MODE SUPPRESSION FOR AMPLIFIER (71) Applicant: MACOM Technology Solutions Holdings, Inc., Lowell, MA (US)

(72) Inventors: Nguyen Nguyen, San Jose, CA (US); Trong Phan, Garden Grove, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 867 days.

(21) Appl. No.: 17/662,515

(22) Filed: May 9, 2022

(65) Prior Publication Data
US 2023/0361725 A1   Nov. 9, 2023

(51) Int. Cl.
H03F 3/45 (2006.01)
H01L 23/66 (2006.01)
H01P 7/08 (2006.01)
H01P 11/00 (2006.01)

(52) U.S. Cl.
CPC ......... *H03F 3/45928* (2013.01); *H01L 23/66* (2013.01); *H01P 7/082* (2013.01); *H01P 11/008* (2013.01); *H01L 2223/6627* (2013.01)

(58) Field of Classification Search
CPC .................. H03F 3/45928; H01L 23/66; H01L 2223/6627; H01P 7/082; H01P 11/008

USPC ......................................................... 330/258
See application file for complete search history.

(56) References Cited

U.S. PATENT DOCUMENTS

| 2008/0088007 A1* | 4/2008 | Quach ..................... H01L 23/66 257/E23.079 |
| 2023/0172514 A1* | 6/2023 | Verstreken ............. A61B 5/311 330/9 |

FOREIGN PATENT DOCUMENTS

CN          114186529 A   *   3/2022

* cited by examiner

*Primary Examiner* — Hafizur Rahman
(74) *Attorney, Agent, or Firm* — Robert D. Atkins; PATENT LAW GROUP: Atkins and Associates, P.C.

(57) ABSTRACT

A semiconductor device has an amplifier and common mode suppression (CMS) circuit formed on a common substrate. The CMS circuit has a first input and second input coupled for receiving an input signal and further has a first output coupled to a first input of the amplifier and a second output coupled to a second input of the amplifier to reduce common mode. The CMS circuit further has a ground plane, a first conductive trace disposed over the ground plane and coupled between the first input and first output, second conductive trace disposed over the ground plane and coupled between the second input and second output, and third conductive trace disposed over the ground plane with a first end of the third conductive trace coupled to the ground plane and a second end of the third conductive trace open circuit to form a resonator.

17 Claims, 11 Drawing Sheets

CIRCUIT AND METHOD OF PROVIDING COMMON MODE SUPPRESSION FOR AMPLIFIER

FIELD OF THE INVENTION

The present invention relates in general to semiconductor devices and, more particularly, to a circuit and method of providing common mode suppression (CMS) for an amplifier.

BACKGROUND

Semiconductor devices are commonly found in modern electronic products. Semiconductor devices vary in the number and density of electrical components. Discrete semiconductor devices generally contain one type of electrical component, e.g., light-emitting diode (LED), small signal transistor, resistor, capacitor, inductor, and oxide semiconductor field-effect transistor (MOSFET). Integrated semiconductor devices typically contain hundreds to millions of electrical components. Examples of integrated semiconductor devices include microcontrollers, microprocessors, and various analog and digital circuits.

Semiconductor devices perform a wide range of functions, such as signal amplification, signal processing, high-speed calculations, transmitting and receiving electromagnetic signals, controlling electronic devices, and transforming sunlight into electricity. Semiconductor devices are found in the fields of communications, power conversion, networks, computers, audio/video, and consumer products. Semiconductor devices are also found in military applications, aerospace, aviation, automotive, industrial controllers, and office equipment.

Figure 1:
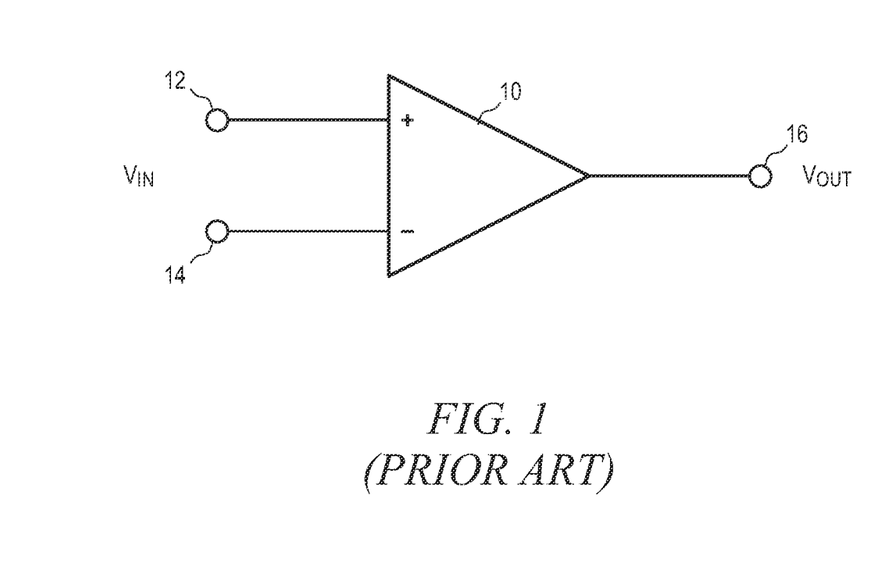
FIG. 1 shows a conventional amplifier.

A common signal processing feature is signal amplification. In FIG. 1, amplifier 10 can be a power amplifier that is used to amplify a differential mode (DM) input signal $V_{IN}$. The DM input signal has two sides, i.e., + and −, each carried on a separate conductive trace. Amplifier 10 has a first input terminal 12 receiving the + side of the input signal $V_{IN}$ and a second input terminal 14 receiving the − side of the input signal. The output signal $V_{OUT}$ is the gain of amplifier 10 multiplied by the difference between the + side and − side of the DM input signal $V_{IN}$.

The input signal $V_{IN}$ may have multiple components within the frequency range. The input signal $V_{IN}$ may have a differential component, where the information content is the difference between the signal on input terminal 12 and the signal on input terminal 14, e.g., $V_{12}$-$V_{14}$. The input signal $V_{IN}$ may also have a common mode (CM) component, where the signal on input terminal 12 is substantially the same as the signal on input terminal 14, possibly with an offset, relative to a common ground. The CM input signal can be amplified with the DM input signal and distort the output signal $V_{OUT}$, which should be solely a function of the DM input signal.

The CM input signal can be caused by radio frequency (RF) noise and electromagnetic interference (EMI) and should be minimized or negated as much as possible. An ideal amplifier has infinite CM rejection and zero CM gain, so that the output voltage is unaffected by signals common to both inputs. However, the real case of a non-ideal amplifier 10 must address CM realities. The output signal $V_{OUT}$ of amplifier 10 is at least inaccurate, based on the DM input signal, and may become unstable, exhibiting oscillations under CM excitation.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 2A:
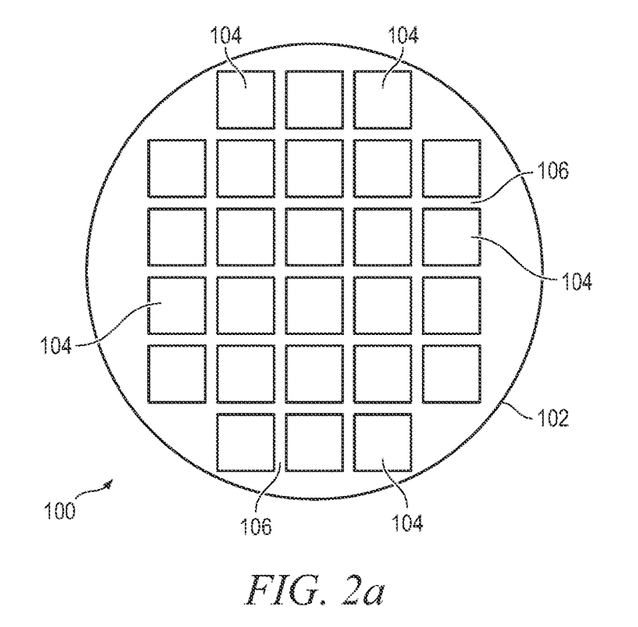
FIGS. 2a-2c illustrate a semiconductor wafer with a plurality of semiconductor die.

FIG. 2a shows semiconductor wafer or substrate 100 with a base substrate material 102, such as silicon (Si), silicon carbide (SiC), silicon germanium, aluminum phosphide, aluminum arsenide, gallium arsenide, gallium nitride, indium phosphide, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 2B:
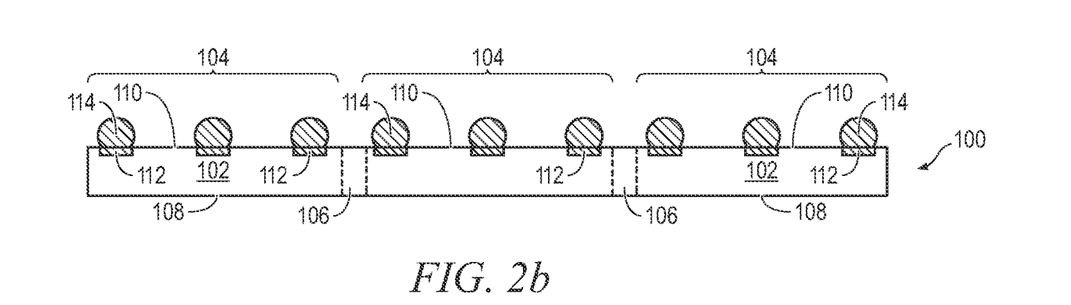

FIG. 2b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more amplifiers, diodes, capacitors, and other circuit elements formed within active surface 110 to implement or be used with analog circuits or digital circuits. In the present embodiment, semiconductor die 104 contains a monolithic CM suppression block and multi-stage amplifier.

An electrically conductive layer 112 is formed over active surface 110 using PVD, CVD, electrolytic plating, electroless plating process, evaporation, or other suitable metal deposition process. Conductive layer 112 can be one or more layers of aluminum (Al), copper (Cu), tin (Sn), nickel (Ni), titanium (Ti), Platinum (Pt), gold (Au), silver (Ag), or other suitable electrically conductive material. Conductive layer 112 operates as contact pads electrically connected to the circuits on active surface 110.

Figure 2C:
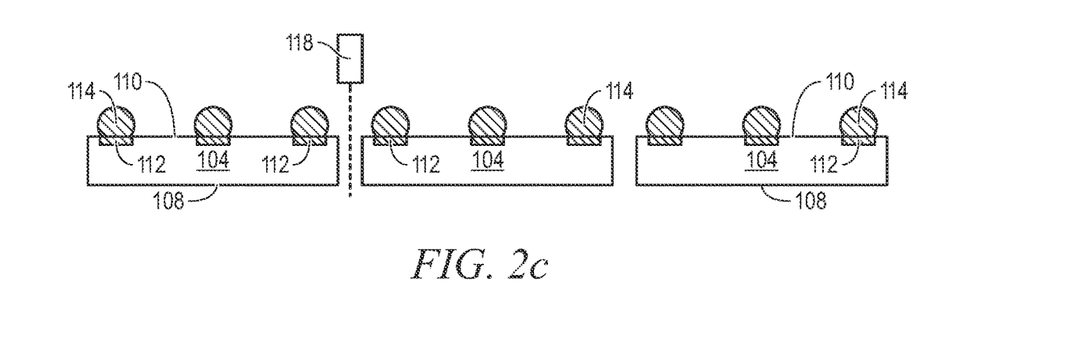

In FIG. 2c, semiconductor wafer 100 is singulated through saw street 106 using a scribe, saw blade, or laser cutting tool 118 into individual semiconductor die 104. The individual semiconductor die 104 can be inspected and electrically tested for identification of known good die or unit (KGD/KGU) post singulation.

Figure 3:
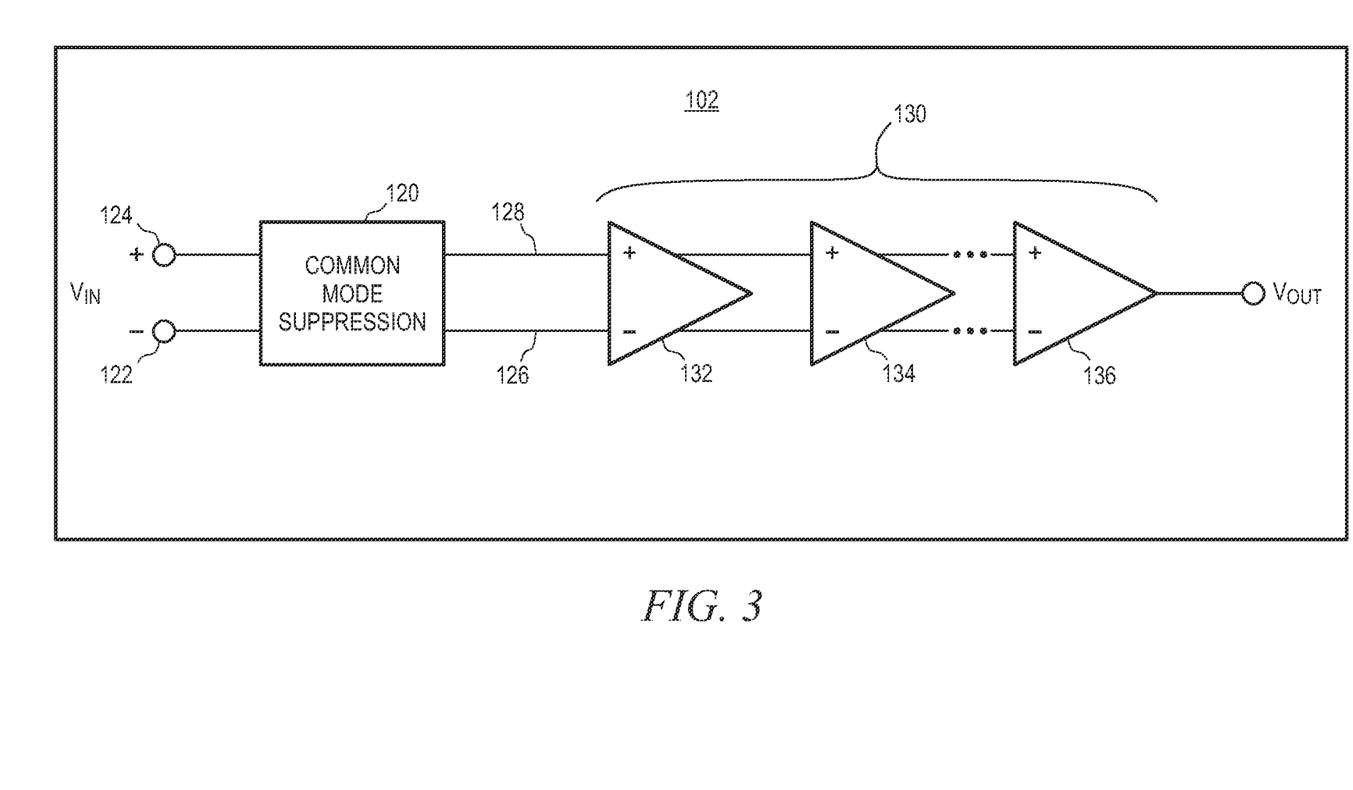
FIG. 3 illustrates a common mode suppression block and multi-stage amplifier formed over a monolithic substrate.

FIG. 3 illustrates common mode suppression (CMS) block or circuit 120 with input terminals 122 and 124 formed on a base substrate material 102. An input signal $V_{IN}$, with a first+side and a second–side, is applied to input terminals 124 and 122, respectively. The input signal $V_{IN}$ contains a DM input signal component and a CM input signal component by nature of RF noise and EMI. The purpose of CMS block 120 is to reduce or suppress the CM input signal component without affecting the DM input signal component. The output terminals 126, 128 of CMS block 120 are coupled to the driver or amplifier 130. Amplifier 130 is also formed on base substrate material 102.

Amplifier 130 can be implemented as a voltage gain amplifier, distributed amplifier, multi-stage driver, hybrid amplifier, linear amplifier, transimpedance amplifier, low noise amplifier, low phase noise amplifier, RF power amplifier, variable gain amplifier, CATV amplifier, etc. In one embodiment, amplifier 130 can be implemented as a multi-stage differential driver, where the output of first stage 132 is the input to second stage 134, and the output of second stage 134 is the input to third stage 136, and so on. After CMS block 120, the DM input signal component of the input signal $V_{IN}$ should be substantially unchanged, while the CM input signal component has been reduced or suppressed by 20-25 dB while passing through the CMS block. In that sense, CMS block 120 operates as a passive CM band-stop filter at the input of amplifier 130. CMS 120 and amplifier 130 are both formed on a monolithic base substrate material 102.

Figure 4A:
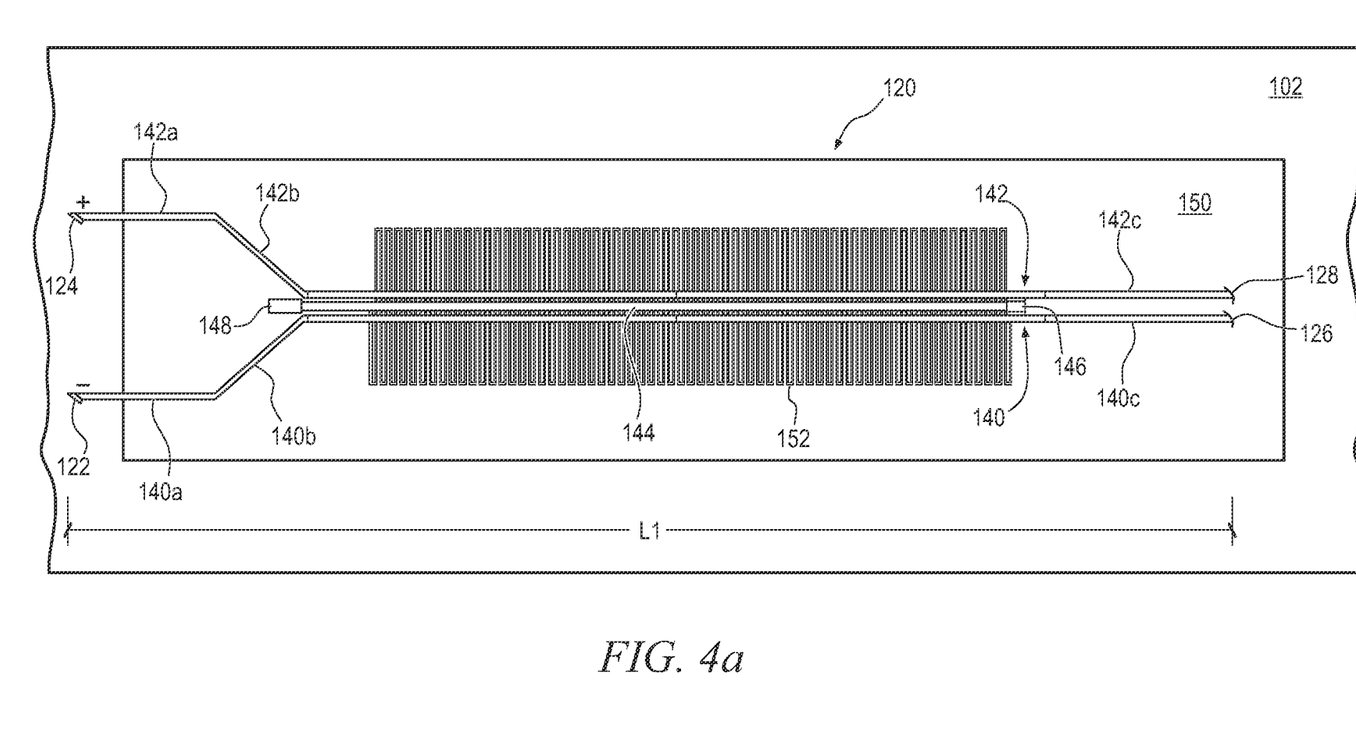
FIGS. 4a-4e illustrate further detail of the CMS block.

FIG. 4a illustrates a top view of further detail of CMS block 120 including input terminals 122 and 124 and output terminals 126 and 128. Elements having a similar function are assigned the same reference numbers in the figures. Features are not necessarily drawn to scale. Conductive trace or microstrip 140 is formed over base substrate material 102 and extends from input terminal 122 to output terminal 126. Starting from input terminal 122, conductive trace 140 includes straight section 140a, angled section 140b, straight section 140c, and terminates with output terminal 126. Conductive trace or microstrip 142 is formed over base substrate material 102 and extends from input terminal 124 to output terminal 128. Starting from input terminal 124, conductive trace 142 includes straight section 142a, angled section 142b, straight section 142c, and terminates with output terminal 128. Conductive traces 140-142 can be formed using PVD, CVD, electrolytic plating, electroless plating process, evaporation, or other suitable metal deposition process. Conductive traces 140-142 can be one or more layers of Al, Cu, Sn, Ni, Ti, Pt, Au, Ag, or other suitable electrically conductive material. Conductive traces 140-142 operate transmission lines.

Ground plane 150 is formed over base substrate material 102. Ground plane 150 includes defected ground or defector 152, further described in FIG. 5. Conductive trace or microstrip 144, shown with a first trace end 146 and a second distal trace end 148, is formed over ground plane 150 and base substrate material 102 using PVD, CVD, electrolytic plating, electroless plating process, evaporation, or other suitable metal deposition process. Conductive trace 144 can be one or more layers of Al, Cu, Sn, Ni, Ti, Pt, Au, Ag, or other suitable electrically conductive material. Conductive trace 144 operates as a resonator with trace end 146 electrically connected to ground plane 150 and centered at a midpoint (MP) between conductive traces 140-142. Trace end 148 is non-connected as an open circuit.

Figure 4B:
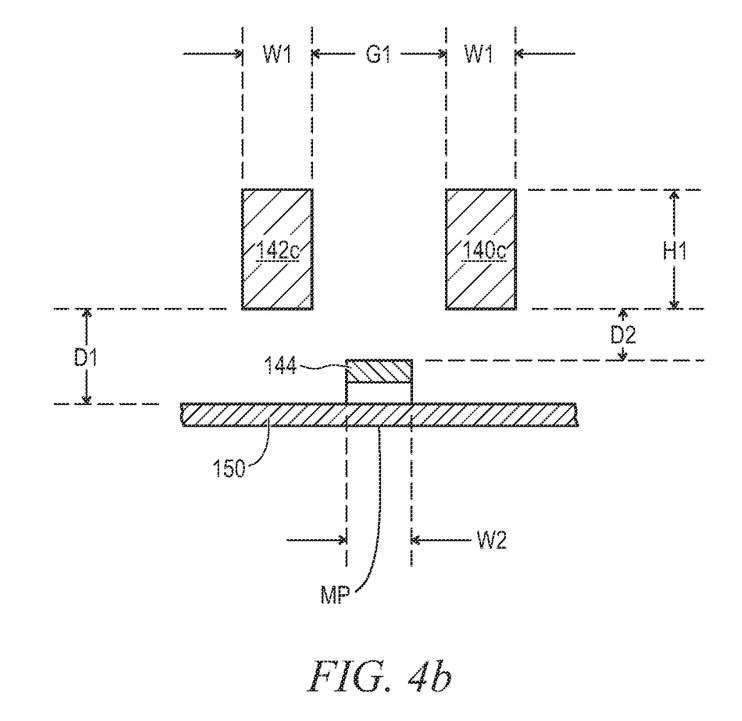

Conductive traces 140-142 each have a length L1, and a width W1 and height H1, as shown in the cross-sectional view in FIG. 4b. In one embodiment, L1 is 475 µm, W1 is 2.0 µm, and H1 is 3.0 µm. Straight section 140c and straight section 142c are separated by gap G1. In one embodiment, G1 is 6.0 µm, and the distance D1 between conductive traces 140-142 and ground plane 150 is 5.63 µm, and the distance D2 between conductive trace 144 and conductive traces 140-142 is 3.88 µm. The width w2 of conductive trace 144 is 4.0 µm. Conductive trace 144 is centered at location MP, the midpoint between conductive traces 140-142. There is a separation of 0.94 µm between conductive layer 144 and ground plane 150.

Figure 4C:
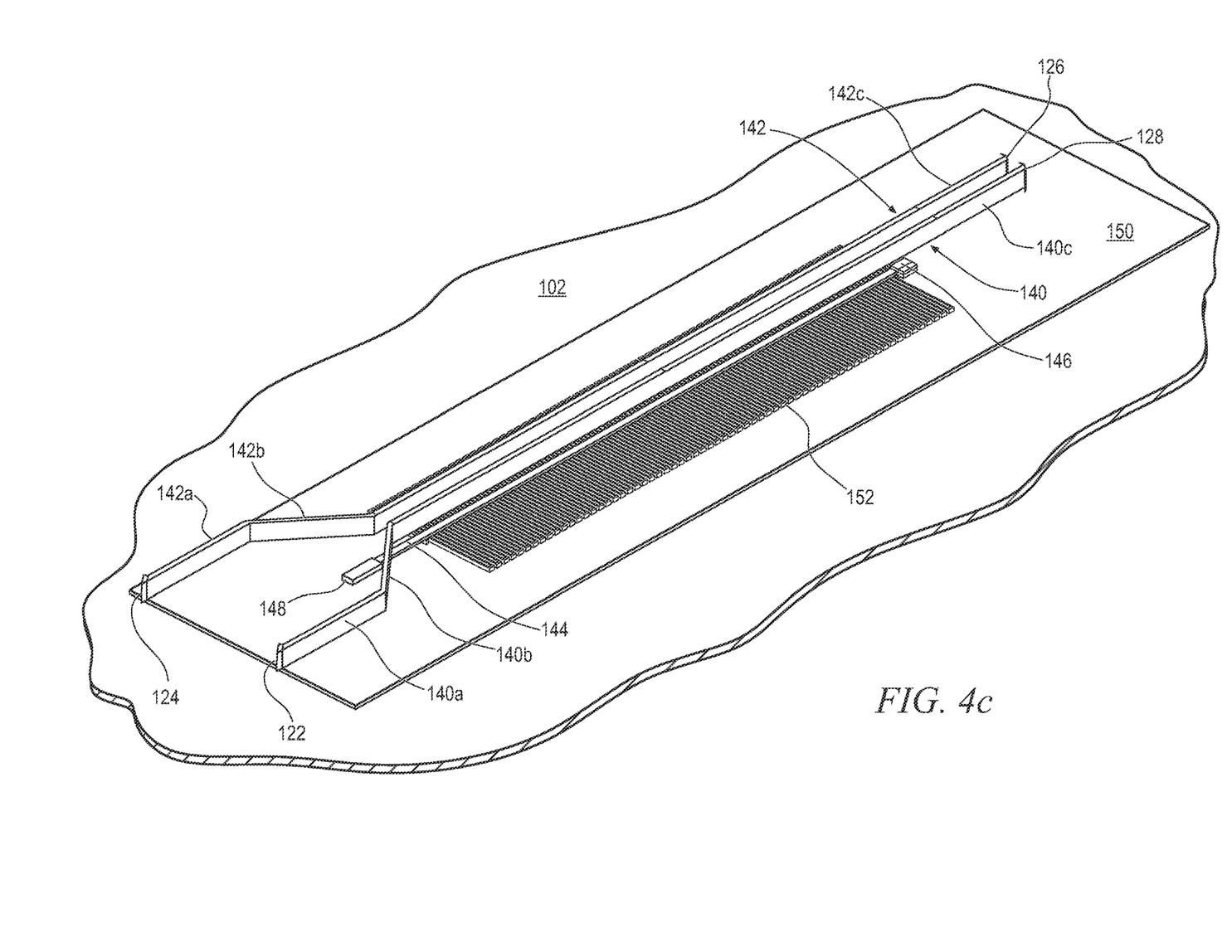
Figure 4D:
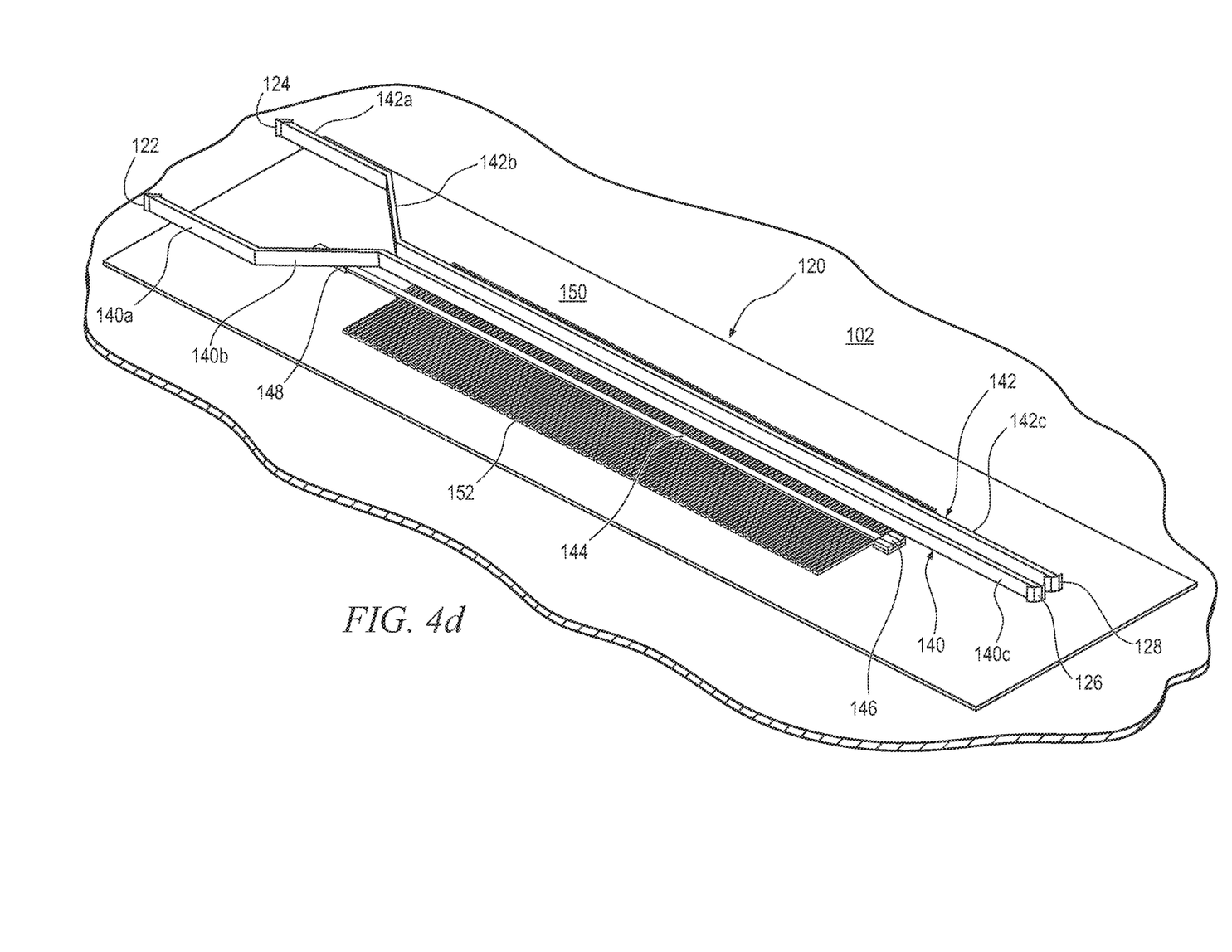

FIG. 4c is a first perspective view of CMS 120 with conductive traces 140, 142, 144, and ground plane 150 formed over base substrate material 102. FIG. 4d is a second perspective view of CMS 120 with conductive traces 140, 142, 144, and ground plane 150 formed over base substrate material 102. FIGS. 4c-4d illustrate conductive trace 144 (open stub resonator) with trace end 146 electrically connected to ground plane 150 and trace end 148 non-connected as an open circuit.

Figure 4E:
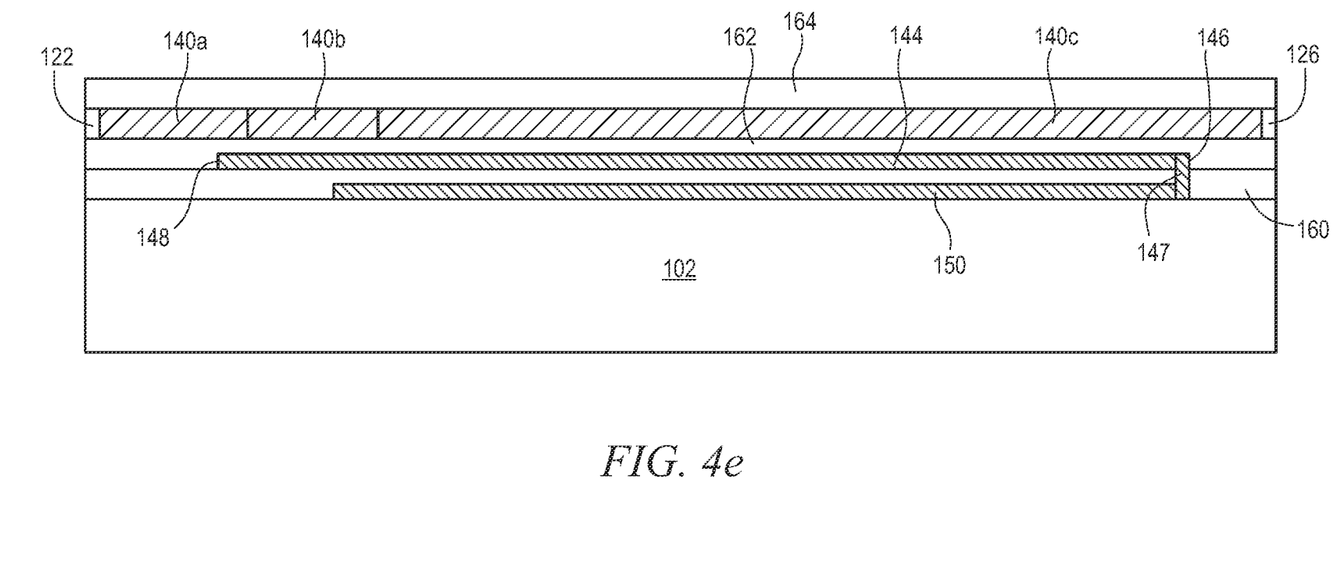

FIG. 4e is a cross-sectional view of CMS 120 including ground plane 150 formed over base substrate material 102. An insulating layer 160 is formed over base substrate material 102 and ground plane 150. Insulating layer 160 contains one or more layers of silicon dioxide (SiO2), silicon nitride (Si3N4), silicon oxynitride (SiON), tantalum pentoxide (Ta2O5), aluminum oxide (Al2O3), solder resist, polymer, polyimide, benzocyclobutene (BCB), polybenzoxazoles (PBO), and other material having similar insulating and structural properties. Insulating layer 160 provides isolation between conductive trace 144 and ground plane 150. Conductive trace 144 is formed over insulating layer 160. A conductive via 147 is formed through insulating layer 160 to electrically connect conductive trace 144 to ground plane 150. An insulating layer 162 is formed over conductive trace 144 and insulating layer 160. Insulating layer 162 contains one or more layers of SiO2, Si3N4, SiON, Ta2O5, Al2O3, solder resist, polymer, polyimide, BCB, PBO, and other material having similar insulating and structural properties. Insulating layer 162 provides isolation between conductive traces 140-142 and conducive trace 144. Conductive traces 140-142 are formed over insulating layer 162. An insulating layer 164 is formed over conductive traces 140-142 and insulating layer 162. Insulating layer 164 contains one or more layers of SiO2, Si3N4, SiON, Ta2O5, Al2O3, solder resist, polymer, polyimide, BCB, PBO, and other material having similar insulating and structural properties. Insulating layer 164 provides protection conductive traces 140-142.

Figure 5:
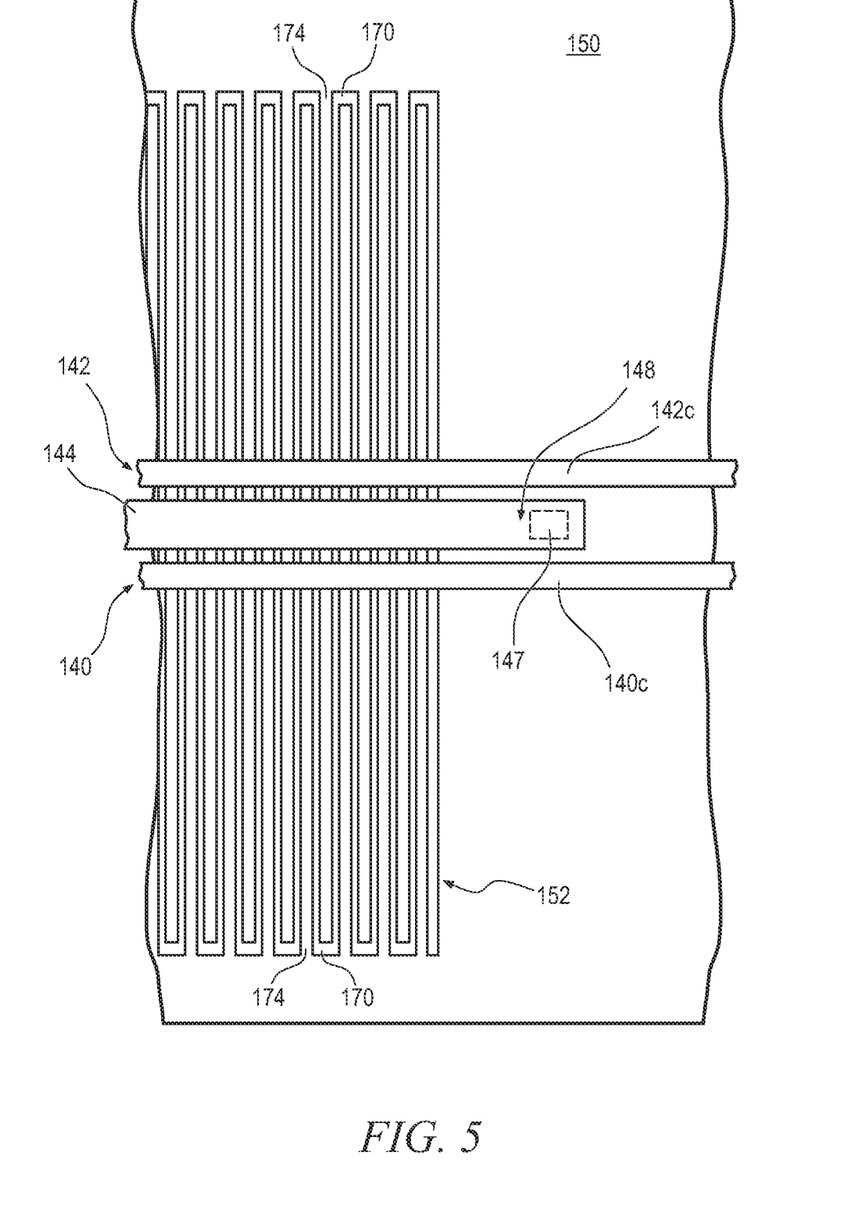
FIG. 5 illustrates further detail of the ground plane and defected ground.

FIG. 5 illustrates further detail of ground plane 150 and conductive traces 140, 142, and 144 formed over base substrate material 102. Ground plane 150 includes serpentine insulating region 170. Serpentine insulating region 170 creates slots 174 of ground plane 150, as referred to as defected ground or defector 152. The return current path to dissipate the CM signal will follow the path of defected ground 152 around serpentine insulating region 170. Trace end 146 is electrically connected to ground plane 150 by way of conductive via 147 through insulating layer 160, see FIG. 4e. Trace end 148 is non-connected as an open circuit.

CMS 120 and amplifier 130 are both formed on monolithic base substrate material 102. CMS 120 is a passive circuit containing conductive traces 140, 142, and 144, defector 152, and ground plane 150. In particular, conductive trace 144 operates as a resonator with trace end 146 connected to ground plane 150 and trace end 148 unconnected or open-circuit, see FIGS. 4a-4e. Defected ground 152 also operates as a resonator. The conductive trace resonator 144, in combination with defected ground 152, reduces the CM signal presented to amplifier 130, without affecting the DM signal. The two resonator work together to achieve wide band cancellation of CM, in the range of 20-100 GHz, centered at 50 GHz. In one embodiment, CMS 120 operates at 60 GHz. CMS 120 provides wide band cancellation between two frequency points. CMS 120 suppresses the CM signal by nature of band-stop ground resonator 144 on return current path ground plane 150. DM is unaffected by return current path ground plane 150. CM signal rejected in return current path ground plane 150.

Figure 6:
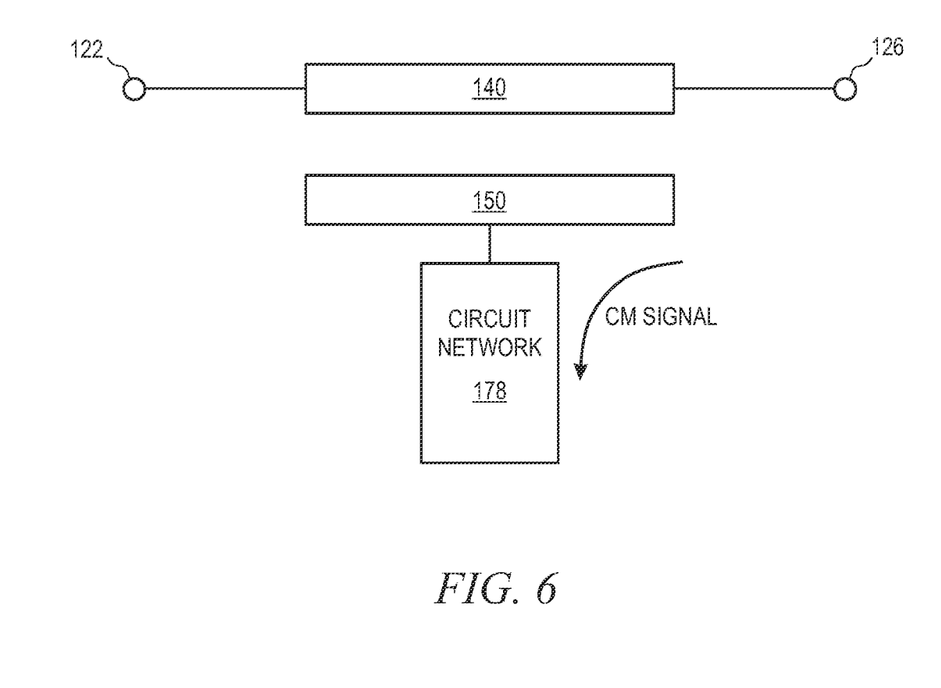
FIG. 6 illustrates a block diagram to explain the conductive trace resonator.

FIG. 6 illustrates a simplified block of CM operation with circuit network 178, capable of suppressing the CM return current. In one embodiment, circuit network 178 includes conductive trace stub 144 and defected ground 152. Alternatively, circuit network 178 can be any passive or active circuit network, e.g., open stub, resonator, shorted stub, capacitor, inductor, or network of passive components, capable of trapping or suppressing the CM signal. Circuit network 178 can be an active network of transistors, diodes, amplifiers, etc., capable of trapping or suppressing the CM return current. In DM, conductive traces 140-142 each carry one side of the differential input signal $V_{IN}$, i.e., V+ and V−, and operate out-of-phase, each reference to the other. Return current always in the opposite conductive traces. In CM, the input signal $V_{IN}$ operates in-phase and has equal amplitude on each side. Defected ground 152 creates a much longer effective return path for CM to reject the CM signal.

Figure 7:
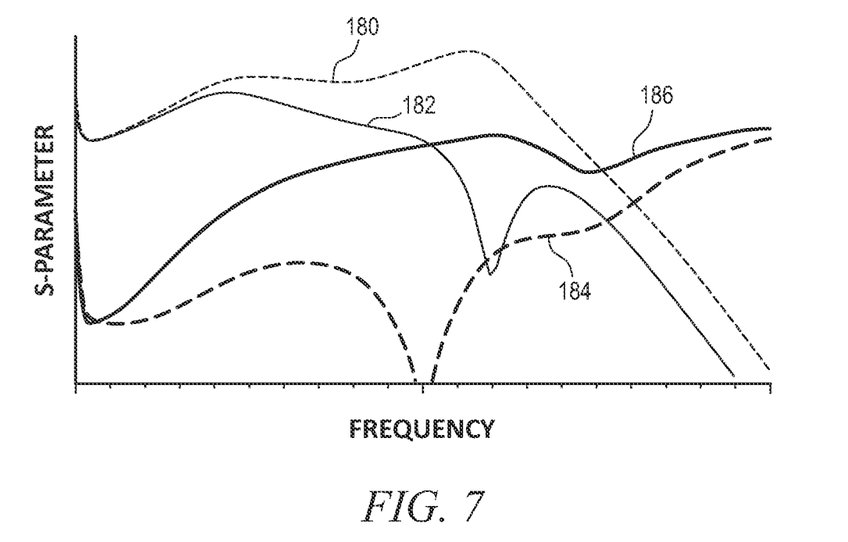
FIG. 7 shows multiple plots of various S-parameters versus frequency.

FIG. 7 illustrates trace plots of S-parameters versus frequency under CM excitation. Trace 180 shows S-parameter Scc21 without CMS 120. Trace 182 shows S-parameter Scc21 with CMS 120. Trace 184 shows S-parameter Scc11 without CMS 120. Trace 186 shows S-parameter Scc11 with CMS 120. CM is reduced, while DM is unaffected.

Figure 8:
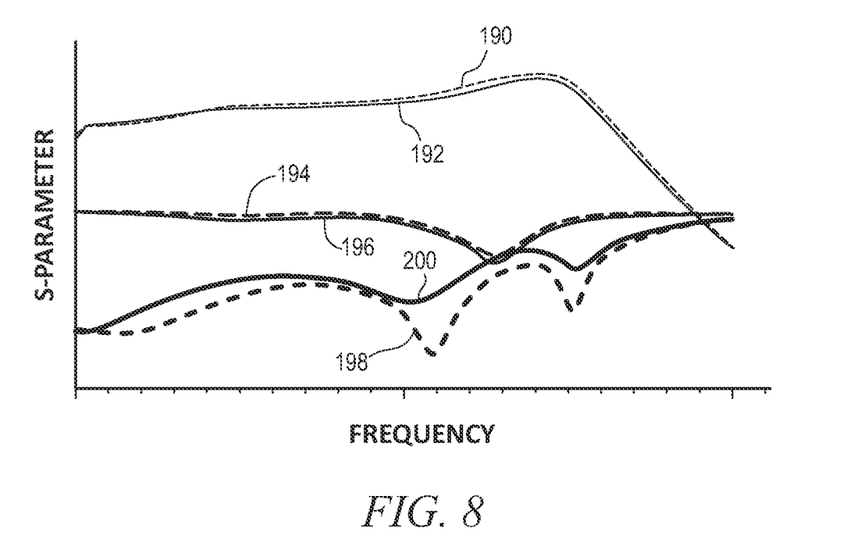
FIG. 8 shows multiple plots of other S-parameters versus frequency.

FIG. 8 illustrates trace plots of S-parameters versus frequency under DM excitation. Trace 190 shows S-parameter S21 without CMS 120. Trace 182 shows S-parameter S21 with CMS 120. Trace 194 shows S-parameter S22 without CMS 120. Trace 196 shows S-parameter Scc11 with CMS 120. Trace 198 shows S-parameter S11 without CMS 120. Trace 200 shows S-parameter S11 with CMS 120. Input return loss is optimized, while DM is unaffected.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
an amplifier; and
a common mode suppression circuit including a first input terminal and second input terminal coupled for receiving an input signal and further including a first output terminal coupled to a first input terminal of the amplifier and a second output terminal coupled to a second input terminal of the amplifier to reduce common mode, wherein the common mode suppression circuit includes,
(a) a ground plane, wherein the ground plane includes an isolation region to form slots within the ground plane,
(b) a first conductive trace disposed over the ground plane and coupled between the first input terminal and first output terminal,
(c) a second conductive trace disposed over the ground plane and coupled between the second input terminal and second output terminal, and
(d) a third conductive trace disposed over the ground plane with a first end of the third conductive trace coupled to the ground plane and a second end of the third conductive trace open circuit.

2. The semiconductor device of claim 1, wherein the first conductive trace includes a first straight portion and an angled portion extending from the first straight portion and a second straight portion extending from the angled portion.

3. The semiconductor device of claim 1, further including a serpentine-shaped insulating region formed over the ground plane.

4. The semiconductor device of claim 1, further including:
a first insulating layer formed between the ground plane and third conductive trace; and
a second insulating layer formed between the third conductive trace and the first conductive trace.

5. The semiconductor device of claim 1, wherein the amplifier includes multiple stages of amplifiers.

6. A semiconductor device, comprising a common mode suppression circuit including a first input terminal and second input terminal coupled for receiving an input signal and further including a first output terminal and a second output terminal providing an output signal with a reduced common mode, wherein the common mode suppression circuit includes,
(a) a ground plane,
(b) a first conductive trace disposed over the ground plane and coupled between the first input terminal and first output terminal,
(c) a second conductive trace disposed over the ground plane and coupled between the second input terminal and second output terminal,
(d) a third conductive trace disposed over the ground plane with a first end of the third conductive trace coupled to the ground plane and a second end of the third conductive trace open circuit,
(e) a first insulating layer formed between the ground plane and third conductive trace, and
(f) a second insulating layer formed between the third conductive trace and the first conductive trace.

7. The semiconductor device of claim 6, further including an amplifier comprising a first input terminal coupled to the first output terminal of the common mode suppression circuit and a second input terminal coupled to the second output terminal of the common mode suppression circuit.

8. The semiconductor device of claim 7, wherein the amplifier includes multiple stages of amplifiers.

9. The semiconductor device of claim 6, wherein the ground plane includes an isolation region to form slots within the ground plane.

10. A method of making a semiconductor device, comprising:
providing a substrate;
forming an amplifier over the substrate;
forming a common mode suppression circuit over the substrate with a first input terminal and second input terminal coupled for receiving an input signal and a first output terminal coupled to a first input terminal of the amplifier and a second output terminal coupled to a second input terminal of the amplifier to reduce common mode, wherein forming the common mode suppression circuit includes,
  (a) forming a ground plane over the substrate, wherein forming the ground plane includes forming an isolation region to provide slots within the ground plane,
  (b) disposing a first conductive trace over the ground plane and coupled between the first input terminal and first output terminal,
  (c) disposing a second conductive trace over the ground plane and coupled between the second input terminal and second output terminal, and
  (d) disposing a third conductive trace over the ground plane with a first end of the third conductive trace coupled to the ground plane and a second end of the third conductive trace open circuit.

11. The method of claim 10, wherein the third conductive trace operates as a resonator.

12. The method of claim 10, further including:
  forming a first insulating layer between the ground plane and third conductive trace; and
  forming a second insulating layer between the third conductive trace and the first conductive trace.

13. The method of claim 10, wherein the amplifier includes multiple stages of amplifiers.

14. A method of making a semiconductor device, comprising:
  providing a substrate;
  forming an amplifier over the substrate;
  forming a common mode suppression circuit over the substrate with a first input terminal and second input terminal coupled for receiving an input signal and a first output terminal coupled to a first input terminal of the amplifier and a second output terminal coupled to a second input terminal of the amplifier to reduce common mode, wherein forming the common mode suppression circuit includes,
    (a) forming a ground plane over the substrate,
    (b) disposing a first conductive trace over the ground plane and coupled between the first input terminal and first output terminal, wherein the first conductive trace includes a first straight portion and an angled portion extending from the first straight portion and a second straight portion extending from the angled portion,
    (c) disposing a second conductive trace over the ground plane and coupled between the second input terminal and second output terminal, and
    (d) disposing a third conductive trace over the ground plane with a first end of the third conductive trace coupled to the ground plane and a second end of the third conductive trace open circuit.

15. The method of claim 14, further including forming a serpentine-shaped insulating region over the ground plane.

16. A semiconductor device, comprising a common mode suppression circuit including a first input terminal and second input terminal coupled for receiving an input signal and further including a first output terminal and a second output terminal providing an output signal with a reduced common mode, wherein the common mode suppression circuit includes,
  (a) a ground plane,
  (b) a first conductive trace disposed over the ground plane and coupled between the first input terminal and first output terminal, wherein the first conductive trace includes a first straight portion and an angled portion extending from the first straight portion and a second straight portion extending from the angled portion,
  (c) a second conductive trace disposed over the ground plane and coupled between the second input terminal and second output terminal, and
  (d) a third conductive trace disposed over the ground plane with a first end of the third conductive trace coupled to the ground plane and a second end of the third conductive trace open circuit.

17. The semiconductor device of claim 16, further including a serpentine-shaped insulating region formed over the ground plane.

* * * * *